US008710158B2

(12) United States Patent
Ueno et al.

(10) Patent No.: US 8,710,158 B2
(45) Date of Patent: Apr. 29, 2014

(54) EPOXY COMPOSITION FOR ENCAPSULATING AN OPTICAL SEMICONDUCTOR ELEMENT

(75) Inventors: Manabu Ueno, Annaka (JP); Miyuki Wakao, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 316 days.

(21) Appl. No.: 13/080,730

(22) Filed: Apr. 6, 2011

(65) Prior Publication Data

US 2011/0251305 A1 Oct. 13, 2011

(30) Foreign Application Priority Data

Apr. 7, 2010 (JP) .................................. 2010-88608

(51) Int. Cl.
*C08G 59/20* (2006.01)
*C08G 59/42* (2006.01)
*C08G 59/62* (2006.01)
*C08L 63/00* (2006.01)
*C08L 83/08* (2006.01)
*C08L 83/10* (2006.01)
*H01L 21/56* (2006.01)

(52) U.S. Cl.
USPC ........... 525/476; 525/474; 525/525; 525/526; 525/528; 525/533; 523/433; 523/435; 523/436; 257/791; 257/793

(58) Field of Classification Search
USPC .......... 257/787, 788, 791, 793; 523/427, 433, 523/435, 436; 525/474, 476, 524, 525, 526, 525/528, 529, 530, 533
See application file for complete search history.

(56) References Cited

U.S. PATENT DOCUMENTS

| | | | |
|---|---|---|---|
| 4,082,719 A | 4/1978 | Liles et al. | |
| 5,492,981 A | 2/1996 | Hoehn et al. | |
| 6,710,377 B2 | 3/2004 | Shimomura | |
| 6,747,293 B2 | 6/2004 | Nitta et al. | |
| 7,985,806 B2 * | 7/2011 | Shiobara et al. | 525/476 |
| 2009/0203822 A1 * | 8/2009 | Shiobara et al. | 524/267 |
| 2011/0201763 A1 | 8/2011 | Noro et al. | |

FOREIGN PATENT DOCUMENTS

| | | | | |
|---|---|---|---|---|
| DE | 278813 A | * | 5/1990 | ............. C08L 63/00 |
| JP | 52-107049 A | | 9/1977 | |
| JP | 7-25987 A | | 1/1995 | |
| JP | 3241338 B2 | | 12/2001 | |
| JP | 2002-314139 A | | 10/2002 | |
| JP | 2002-314143 A | | 10/2002 | |
| JP | 2002-327126 A | | 11/2002 | |
| JP | 2002-338833 A | | 11/2002 | |
| JP | 3399652 B2 | | 4/2003 | |
| JP | 2004-99751 A | | 4/2004 | |
| JP | 2004-238589 A | | 8/2004 | |
| JP | 2005-263869 A | | 9/2005 | |
| JP | 2011-168701 A | | 9/2011 | |

OTHER PUBLICATIONS

Partial machine translation of DD 278813 A (no date).*
Derwent abstract of DD 278813 A (1990).*
Translation of DD 278813 A1 (no date).*

* cited by examiner

*Primary Examiner* — Michael J Feely

(74) *Attorney, Agent, or Firm* — Birch, Stewart, Kolasch & Birch, LLP

(57) ABSTRACT

The present invention has a purpose of providing an epoxy composition for encapsulating an optical semiconductor element which composition provides a cured product having a low gas permeability and excellent curability in a form of a thin film together with good light transmission and crack resistance. The present invention provides a composition comprising (A) a silicone-modified epoxy compound represented by the formula (1), (B) a curing agent and (C) a polyhydric alcohol. The present invention further provides a composition comprising a composition prepared by reacting (A) the silicone-modified epoxy compound, (B) the curing agent and (C) the polyhydric alcohol and (D) a curing catalyst, and a cured product thereof.

11 Claims, No Drawings

EPOXY COMPOSITION FOR ENCAPSULATING AN OPTICAL SEMICONDUCTOR ELEMENT

CROSS REFERENCE

This application claims the benefits of Japanese Patent Application No. 2010-88608 filed on Apr. 7, 2010, the contents of which are herein incorporated by reference.

FIELD OF THE INVENTION

The present invention relates to a composition for encapsulating an optical semiconductor element, more specifically, an encapsulating composition which has low gas permeability and excellent curability in a form of a thin film, and a cured product thereof.

BACKGROUND OF THE INVENTION

Conventionally, a transparent epoxy resin composition comprising an alicyclic epoxy resin, a curing agent and a curing catalyst has been widely used as an encapsulating composition for optical semiconductor elements. The epoxy resin composition is poured into a mold in which an optical semiconductor element is placed in a molding method such as a casting or transfer molding method, and cured to encapsulate the optical semiconductor element in a cured product (Japanese Patent NO. 3241338 and Japanese Patent Application Laid-Open No. Hei-7-25987).

In recent years, as brightness and output of blue-LEDs and white-LEDs have continued increasing, such problem that a LED element encapsulated with a conventional transparent epoxy resin discolors over time, i.e., yellowing, is caused by the blue light or the ultraviolet light which have short wavelengths. Further, a water absorption rate of a cured product obtained from the transparent epoxy resin composition is so high that the moisture resistance is poor.

Japanese Patent Application Laid-Open Nos. 2002-327126 and 2002-338833 disclose, as a coating and protective material for optical semiconductor elements, a resin composition which comprises an organic compound or silicone resin which has at least two carbon-carbon double bonds reactive with an SiH group; a silicon compound having at least two SiH groups; and a hydrosilylation catalyst.

However, a cured product obtained from the aforementioned silicone resin composition has such demerits that a surface of the cured product is tacky to collect dust and a light transmission is low. In order to solve the aforesaid problems, Japanese Patent Application Laid-Open Nos. 2002-314139 and 2002-314143 disclose a coating and protective material for optical semiconductor elements, which material contains a high hardness silicone resin. However, toughness and adhesiveness of the high hardness silicone resin are poor. Therefore, in a case of case-type light emitting semiconductor devices having a light emitting element placed in a ceramic or plastic housing, the silicone resin peels off from the ceramic or plastic housing to cause cracks during the housing filled with the silicone resin composition is subjected to a heat shock test at −40 degrees C and 120 degrees C.

The composition comprising an epoxy resin and a silicone resin was proposed in Japanese Patent Application Laid-Open No. Sho-52-107049 and Japanese Patent No. 3399652. However, the composition has such problems as poor adhesiveness and discoloration due to light degradation. Further, Japanese Patent Application Laid-Open No. 2004-238589 discloses a cured product obtained by curing a composition which comprises a siloxane compound having an epoxy group and/or an oxetanyl group and a silsesquioxane compound in the presence of a cation curing catalyst in order to improve strength of the resin and an UV resistance. However, the composition has a problem that the cured product thus obtained is corroded and discolored by oxonium ions which are derived from the cation curing catalyst. Japanese Patent Application Laid-Open No. 2005-263869 discloses a B-stage resin composition comprising a silsesquioxane compound and a hydrogenated epoxy resin. However, the composition has a problem such as a poor ultraviolet resistance. Japanese Patent Application Laid-Open No. 2004-99751 discloses a composition comprising an organopolysiloxane having a group derived from an isocyanuric acid and an epoxy resin, but the composition is not a transparent resin composition for encapsulating an optical semiconductor element.

PRIOR LITERATURES

Patent Literature

[Patent Literature 1] Japanese Patent No. 3241338
[Patent Literature 2] Japanese Patent Application Laid-Open No. Hei-7-25987
[Patent Literature 3] Japanese Patent Application Laid-Open No. 2002-327126
[Patent Literature 4] Japanese Patent Application Laid-Open No. 2002-338833
[Patent Literature 5] Japanese Patent Application Laid-Open No. 2002-314139
[Patent Literature 6] Japanese Patent Application Laid-Open No. 2002-314143
[Patent Literature 7] Japanese Patent Application Laid-Open No. Sho-52-107049
[Patent Literature 8] Japanese Patent No. 3399652
[Patent Literature 9] Japanese Patent Application Laid-Open No. 2004-238589
[Patent Literature 10] Japanese Patent Application Laid-Open No. 2005-263869
[Patent Literature 11] Japanese Patent Application Laid-Open No. 2004-99751

DISCLOSURE OF THE INVENTION

The Problems to be Solved by the Invention

The amount of silicone components contained in a resin composition is increased by the use of a silicone-modified epoxy resin instead of an epoxy resin, so that reliability of the cured product against heating is improved. However, the cured product of the resin composition has a high gas permeability and, therefore, the resin composition does not exhibit the excellent properties of silicone at high temperature and high humidity.

Under the above circumstances, the present invention has a purpose of providing an epoxy composition for encapsulating an optical semiconductor element which composition provides a cured product having a low gas permeability and excellent curability in a form of a thin film together with good light transmission and crack resistance.

Means to Solve the Problems

To solve the aforesaid problems, the present inventors have made research and found that an alkyl chain introduced in a cross-linked structure of a cured product which is derived from a polyhydric alcohol enables a cured product to attain a low gas permeability and excellent curability in a form of a thin film.

Thus, the present invention provides a composition comprising (A) a silicone-modified epoxy compound represented by the following formula (1),

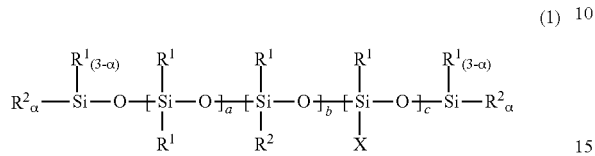

(1)

wherein $R^1$ is, independently of each other, a substituted or unsubstituted monovalent hydrocarbon group having 1 to 20 carbon atoms, $R^2$ is a group represented by the following formula (2), X is a group represented by the following formula (3), c is an integer of from 0 to 10, a and b are, independently of each other, an integer of from 0 to 100, provided that $0 \le a+b \le 100$, and $\alpha$ is, independently of each other, 0 or 1, provided that the aforesaid formula (1) has at least one $R^2$,

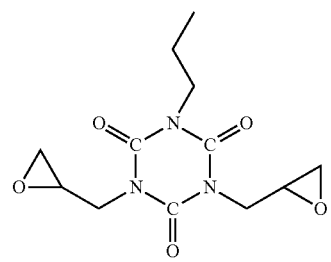

(2)

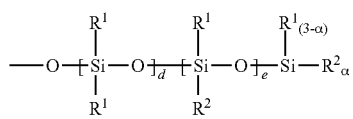

(3)

wherein d and e are, independently of each other, an integer of from 0 to 100, provided that $0 \le d+e \le 100$, and $\alpha$ is as defined above, (B) a curing agent of 0.5 to 1.5 equivalents per equivalent of the epoxy group of the component (A), and (C) a polyhydric alcohol of 0.01 to 1.0 equivalents per equivalent of the curing agent (B).

The present invention further provides
a composition comprising
a composition prepared by reacting (A) a silicone-modified epoxy compound represented by the following formula (1),

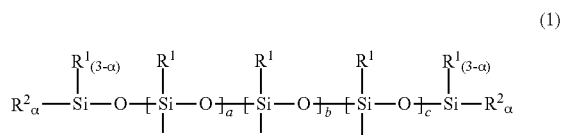

(1)

wherein $R^1$ is, independently of each other, a substituted or unsubstituted monovalent hydrocarbon group having 1 to 20 carbon atoms, $R^2$ is a group represented by the following formula (2), X is a group represented by the following formula (3), c is an integer of from 0 to 10, a and b are, independently of each other, an integer of from 0 to 100, provided that $0 \le a+b \le 100$, and $\alpha$ is, independently of each other, 0 or 1, provided that the aforesaid formula (1) has at least one $R^2$, (2)

(3)

wherein d and e are, independently of each other, an integer of from 0 to 100, provided that $0 \le d+e \le 100$, and $\alpha$ is as defined above;

(B) a curing agent of 0.5 to 1.5 equivalents per equivalent of the epoxy group of the component (A); and (C) a polyhydric alcohol of 0.01 to 1.0 equivalents per equivalent of the curing agent (B), and (D) 0.1 to 3 part by mass of a curing catalyst per total 100 parts by mass of the aforesaid components (A) and (B).

The present invention also provides a cured product thereof.

Effects of the Invention

On the account of an alkyl chain introduced in a cross-linked structure which is derived from a polyhydric alcohol, a cured product obtained from the present composition has a low gas permeability and excellent curability in a form of a thin film to attain highly reliable encapsulation of optical semiconductor elements.

BEST MODE OF THE INVENTION

One aspect of the present invention is a composition comprising a silicone-modified epoxy compound (A), a curing agent (B) and a polyhydric alcohol (C). The components will be described below in detail.

(A) Silicone-Modified Epoxy Compound

The silicone-modified epoxy compound is represented by the afore-mentioned formula (1) and is characterized by at least one 3-(3,5-diglycidylisocyanuryl) propyl group represented by the afore-mentioned formula (2) in the molecule.

In the afore-mentioned formula (1), $R^1$ is, independently of each other, an unsubstituted or substituted monovalent hydrocarbon group having 1 to 20, preferably 1 to 6, carbon atoms. Examples of the monovalent hydrocarbon group include alkyl groups such as methyl, ethyl, propyl and butyl groups; cycloalkyl groups such as cyclopentyl, cyclohexenyl and norbornyl groups; aryl groups such as a phenyl group. A part or whole of their hydrogen atoms bonded to a carbon atom may be replaced with a group having an oxygen atom, a nitrogen atom, a sulfur atom or a halogen atom to give, for instance, a 3,3,3-trifluoro-propyl group, a 3-hydroxypropyl group and a 3-aminopropyl group. In particular, a methyl group and a phenyl group are preferred. Ninety mole % or more of the group represented by $R^1$ is preferably a methyl group.

In the afore-mentioned formula (1), c is an integer of from 0 to 10, preferably 0 to 5, and a, b, d and e are, independently of each other, an integer of from 0 to 100, preferably 0 to 20, more preferably 0 to 10, provided that $0 \leq a+b \leq 100$, preferably $0 \leq a+b \leq 60$, and $0 \leq d+e \leq 100$, preferably $0 \leq d+e \leq 60$. If a, b, d or e is more than 100, the ratio of the epoxy group is low and, therefore, the effect of the epoxy group is less.

The examples of the silicone-modified epoxy compound include the following.

exceeds the afore-mentioned upper limit, unreacted 1-allyl-3,5-diglycidylisocyanurate remains in the composition, which is not preferred.

Any known platinum catalyst can be used, in particular, a 2% solution of chloroplatinic acid in octyl alcohol is preferred. The platinum catalyst is preferably used in an amount of 5 to 50 ppm as a platinum metal. The reaction may be conducted at 80 to 150 degrees C, preferably 80 to 100 degrees C, for 1 to 8 hours to prepare an envisaged compound with a high yield. Further, a solvent such as aromatic or ketone solvent may be used in the reaction.

The examples of the siloxane represented by the afore-mentioned formula (4) include the following.

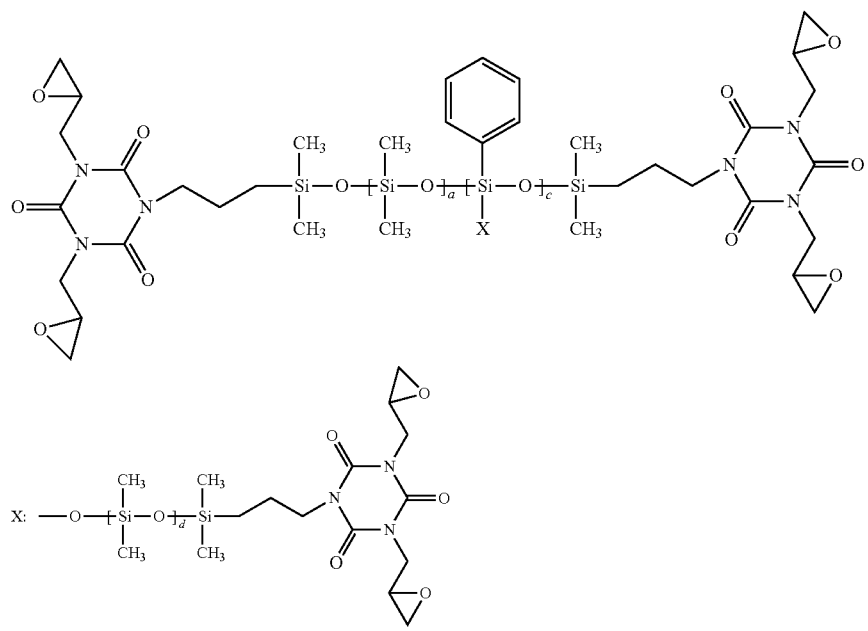

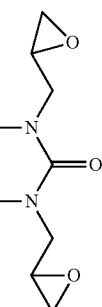

In these formulas, a, c and d are as defined above.

The compound represented by the formula (1) can be prepared easily in a method where a siloxane represented by the following formula (4) is reacted with 1-allyl-3,5-diglycidyl-isocyanurate of from 0.6 to 1.3 equivalents, preferably 0.7 to 1.2 equivalents, per equivalent of the hydrosilyl group in formula (4). The siloxane may be used alone or in combination of two or three of them.

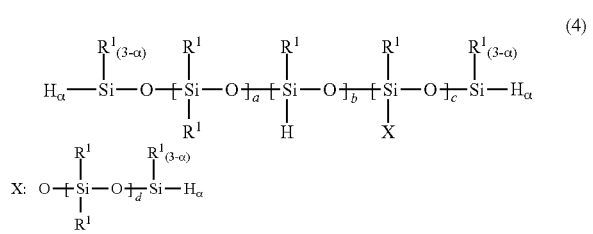

(4)

In these formulas, $R^1$, a, b, c and d are as defined above, and α is, independently of each other, 0 or 1, provided that the afore-mentioned formula (4) has at least one SiH group.

If the amount of 1-allyl-3,5-diglycidylisocyanurate is less than the afore-mentioned lower limit, a large quantity of unreacted hydrosilyl group remain in the composition to cause bubbles in curing of the composition. If the amount

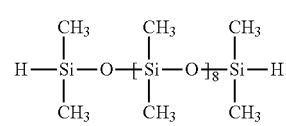

(5)

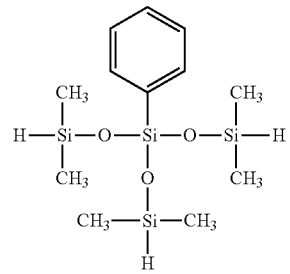

(6)

The liner siloxane represented by the afore-mentioned formula (5) is preferred for obtaining a cured tough and flexible product. The branched siloxane represented by the afore-mentioned formula (6) is preferred for obtaining a cured hard and rigid product.

(B) Curing Agent

The curing agent reacts with the epoxy group of the silicone-modified epoxy compound (A) to form a cross-linked structure. Examples of the curing agent include widely used amine curing agents, phenolic curing agents and acid anhydride curing agents. Among these, acid anhydride curing agents are preferred for the reason that a light transmission and heat resistance of a cured product are improved.

Examples of the acid anhydride curing agent include succinic anhydride, phthalic anhydride, maleic anhydride, trimellitic anhydride, pyromellitic anhydride, hexahydrophthalic anhydride, 3-methyl-hexahydrophthalic anhydride, 4-methyl-hexahydrophthalic anhydride, mixtures of 4-methyl-hexahydrophthalic anhydride and hexahydrophthalic anhydride, tetrahydrophthalic anhydride, methyl-tetrahydrophthalic anhydride, nadic anhydride, methylnadic anhydride, norbornane-2,3-dicarboxylic anhydride, methyl-norbornane-2,3-dicarboxylic anhydride, and methylcyclohexenedicarboxylic anhydride. The amount of the curing agent ranges from 0.5 to 1.5 equivalents, preferably 0.8 to 1.2 equivalents, per equivalent of the epoxy group of the component (A).

(C) Polyhydric Alcohol

The polyhydric alcohol is added to give low gas permeability and excellent thin-film curability to a cured product. As the polyhydric alcohol, polyhydric alcohols having a liner alkyl group are preferred.

The polyhydric alcohol has 2 to 10, preferably 2 or 3, hydroxyl groups, and has 2 to 10, preferably 2 to 6, carbon atoms. Preferred are dihydric alcohols such as ethylene glycol, diethylene glycol, trimethylene glycol, triethylene glycol, propylene glycol, 1,2-propanediol, 1,3-propanediol, 1,4-butanediol, 1,6-hexanediol and hydroquinone; and trihydric alcohols such as glycerin. More preferred are 1,3-propanediol and 1,4-butanediol. The amount of the polyhydric alcohol ranges from 0.01 to 1.0 equivalent, preferably 0.09 to 0.13 equivalent, per equivalent of the curing agent (B).

Another aspect of the present invention is a composition comprising a composition prepared by reacting the silicone-modified epoxy compound (A), the curing agent (B) and the polyhydric alcohol (C), and a curing catalyst (D).

The silicone-modified epoxy compound (A), the curing agent (B) and the polyhydric alcohol (C) are mixed and stirred at a temperature of 40 to 100 degrees C, preferably 60 to 80 degrees C, for 1 hour to 100 hours, preferably 2 to 12 hours, more preferably 2 to 5 hours, to obtain a composition. In the reaction, the polyhydric alcohol (C) reacts with a part of the silicone-modified epoxy compound (A) and/or the curing agent (B), whereby an alkyl chain derived from the polyhydric alcohol (C) is introduced in the silicone-modified epoxy compound (A) and/or the curing agent (B). The amount of the polyhydric alcohol (C) ranges from 0.01 to 1.0 equivalent, preferably 0.09 to 0.13 equivalent, per equivalent of the curing agent (B). In the reaction, preferred is that all of the polyhydric alcohol (C) reacts with the silicone-modified epoxy compound (A) and/or the curing agent (B). It is preferred that the alkyl chain is introduced in an amount of from 0.5 to 10 mass %, preferably 1.0 to 3.0 mass %, based on a total mass of the composition after the reaction.

(D) Curing Catalyst

The curing catalyst (D) is used to ensure that the reaction of the epoxy group of the component (A) with the epoxy-reactive group of the component (B) is completed smoothly in a short period of time. The curing catalyst may be one or more quaternary phosphonium salts, particularly one or more quaternary phosphonium salts represented by the following formula (7) or (8). On the account of the catalyst, a cured product is transparent, is not tacky on the surface, undergoes no discoloration in reflow process and has a highly reliable moldability. One preferred example of a quaternary phosphonium salt other than the compounds represented by formula (7) or (8) is a quaternary phosphonium bromide, known as U-CAT5003, ex San-Apro Co. Ltd.

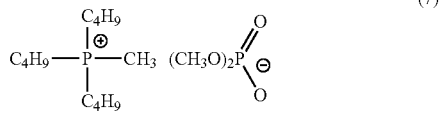
(7)

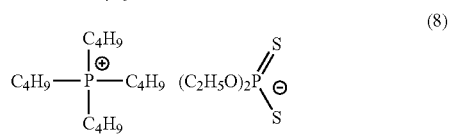
(8)

The curing catalyst may be used in combination with organic phosphine curing catalysts such as triphenylphosphine and diphenylphosphine; tertiary amine curing catalysts such as 1,8-diazabicyclo(5,4,0)undecene-7, triethanolamine and benzyldimethylamine; and imidazoles such as 2-methylimidazole and 2-phenyl-4-methylimidazole.

The amount of the curing catalyst (D) ranges from 0.1 to 3 part by mass, preferably 0.2 to 0.5 part by mass, relative to total 100 parts by mass of the components (A) and (B). If the amount of the curing catalyst is less than the afore-mentioned lower limit, the curing catalyst may not provide sufficient acceleration of the reaction between the components (A) and (B). If the amount of the curing catalyst is more than the afore-mentioned upper limit, discoloration may cause in curing or a reflow process.

The composition of the present invention may further comprise an epoxy resin (E), an antioxidant (F), an ultraviolet absorbing agent (G), a fluorescent material (H), an adhesion-improving agent (I) and an inorganic filler (J). Each component will be described below in detail.

(E) Epoxy Resin

The composition of the present invention may comprise an epoxy resin having at least two epoxy groups in a molecule. The amount of the epoxy resin may be such as not to impair their property, and ranges from 0 to 50 part by mass, preferably from 0.1 to 10 part by mass, relative to total 100 parts by mass of the components (A) and (B). Examples of the epoxy resin include aromatic epoxy resins such as bisphenol A epoxy resins, bisphenol F epoxy resins, phenol novolak epoxy resins, cresol novolak epoxy resins, naphthalene epoxy resins, biphenyl epoxy resins, phenol aralkyl epoxy resins and biphenyl aralkyl epoxy resins; and non-aromatic epoxy resins such as hydrogenated epoxy resins obtained by hydrogenating the aromatic ring of the aforesaid epoxy resins; dicyclopentadiene epoxy resins, alicyclic epoxy resins and triglycidyl isocyanurate, but not limited thereto. The epoxy resin may be used alone or in combination of two or more of them. Among these, the hydrogenated epoxy resin, the alicyclic epoxy resin and the epoxy resins having an isocyanurate ring are preferred to prevent a light degradation of a cured product.

(F) Antioxidant

The antioxidant may be contained in the present composition to improve heat resistance of a cured product. A hindered phenol antioxidant can be used as the antioxidant. Examples of the hindered phenol antioxidant include pentaerythritol tetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'- thiodi-p-cresol, N,N'-hexane-1,6-diylbis[3-(3,5-di-tert-butyl-4-hydroxyphenylpropionamide)], benzenepropanoic acid, 3,5-bis(1,1-dimethylethyl)-4-hydroxy, alkyl ester having C7-C9 side chain, diethyl[[3,5-bis(1,1-dimethylethyl)-4-hydroxyphenyl]methyl]phosphonate, 2,2'-ethylenebis[4,6-di-tert-butylphenol], 3,3',3",5,5',5"-hexa-tert-butyl-a,a',a"-(mesitylene-2,4,6-triyl)tri-p-cresol, calciumdiethylbis[[3,5-bis(1,1-dimethylethyl)-4-hydroxyphenyl]methyl]phosphonate, 4,6-bis(octylthiomethyl)-o-cresol, 4,6-bis(dodecylthiomethyl)-o-cresol, ethylenebis(oxyethylene)bis[3-(5-tert-butyl-4-hydroxy-m-tolyl)propionate], hexamethylenebis[3-(3,5-di-tert-butyl-4-hydroxyphenyl)propionate], 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6-(1H,3H,5H)-trione, 6,6'-di-tert-butyl-4,4'-tiodi-m-cresol, diphenylamine, reaction product of N-phenylbenzenamine and 2,4,4'-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyltridecyl)-2H-1-benzopyran-6-ol, 2',3-bis[[3-[3,5-di-tert-butyl-4-hydroxyphenyl]propionyl]]propionohydrazide, didodecyl 3,3'-thiodipropionate and dioctadecyl 3,3'-thiodipropionate.

Alternatively, phosphorus antioxidants may also be used as the antioxidant in the present composition. Examples of the phosphorus antioxidants include triphenyl phosphite, bis[2,4-bis(1,1-dimethylethyl)-6-methylphenyl]ethyl ester of phosphorous acid, tris(2,4-di-t-butylphenyl)phosphite, tetrakis(2,4-di-tert-butylphenyl)[1,1-biphenyl]-4,4'-diylbisphosphonite, 2,2',2"-nitrilo[triethyl-tris[3,3',5,5'-tetra-tert-butyl-1,1'-biphenyl-2,2'-diyl]]phosphite, and diethyl[[3,5-bis(1,1-dimethylethyl)-4-hydroxyphenyl]methyl]phosphonate. The phosphorus antioxidant may be used in combination with the afore-mentioned hindered phenol antioxidant. The amount of the antioxidant ranges from 0 to 10 part by mass, preferably 0.1 to 1 part by mass, relative to total 100 parts by mass of the components (A) and (B).

(G) Ultraviolet Absorbing Agent

The ultraviolet absorbing agent may be contained in the present composition to improve light resistance. A preferred ultraviolet absorbing agent is a hindered amine ultraviolet absorbing agents. The amount of the ultraviolet absorbing agent ranges from 0 to 10 part by mass, preferably 0.1 to 1 part by mass, relative to total 100 parts by mass of the components (A) and (B). Examples of the ultraviolet absorbing agent include 2,2,4,4-tetramethyl-20-(β-myristyl-oxycarbonyl)-ethyl-7-oxa-3,20-diaza-dispiro[5.1.11.2]-heneicosanone-21, 2,2,4,4-tetramethyl-20-(β-lauryl-oxycarbonyl)-ethyl-7-oxa-3,20-diaza-dispiro[5.1.11.2]-heneicosanone-21, bis(1,2,2,6,6-pentamethyl-4-piperidyl)[[3,5-bis(1,1-dimethylethyl)-4-hydroxyphenyl]methyl]butylmalonate, bis(2,2,6,6-tetramethyl-4-piperidyl)sebacate, poly[{6-(1,1,3,3-tetramethylbutyl)amino-1,3,5-triazin-2,4-diyl}{(2,2,6,6-tetramethyl-4-piperidyl)imino}hexamethylene {(2,2,6,6-tetramethyl-4-piperidyl)imino}], 2-(2H-benzotriazol-2-yl)-4,6-bis(1-methyl-1-phenylethyl)phenol, 2,2',2"-nitrilo[triethyl-tris[3,3',5,5'-tetra-tert-butyl-1,1'-biphenyl-2,2'-diyl]]phosphite and 2-(2H-benzotriazol-2-yl)-4,6-di-tert-pentylphenol.

(H) Fluorescent Material

The fluorescent material may be contained in the present composition for conversion of an emission wavelength of an LED such as a blue LED or a UV-LED. Any known fluorescent materials can be used. Examples of particularly advantageous typical yellow fluorescent materials are these containing fluorescent particles of a garnet type represented by the general formula $A_3B_5O_{12}$:M, wherein the component A indicates at least one element selected from the group consisting of Y, Gd, Tb, La, Lu, Se and Sm; the component B indicates at least one element selected from the group consisting of Al, Ga and In; and the component M indicates at least one element selected from the group consisting of Ce, Pr, Eu, Cr, Nd and Er. Examples of fluorescent material for a light-emitting diode which emits white light, equipped with a light-emitting diode chip which emits blue light, include a $Y_3Al_5O_{12}$:Ce phosphor and a $(Y, Gd, Tb)_3(Al, Ga)_5O_{12}$:Ce phosphor. Examples of other fluorescent materials include $CaGa_2S_4$:$Ce^{3+}$ and $SrGa_2S_4$:$Ce^{3+}$, $YAlO_3$:$Ce^{3+}$, $YGaO_3$:$Ce^{3+}$, $Y(Al,Ga)O_3$:$Ce^{3+}$, and $Y_2SiO_5$:$Ce^{3+}$. Furthermore, in order to generate mixed color light, aluminates doped with rare earth element and orthosilicates doped with rare earth element besides these phosphors may be suitable. The amount of the fluorescent material ranges from 0 to 100 part by mass, preferably 0.1 to 1 part by mass, relative to total 100 parts by mass of the components (A) and (B).

(I) Adhesion-Improving Agent

The adhesion-improving agent may be added in the present composition to improve adhesivity of a cured product. A preferred adhesion-improving agent is a mercapto silane coupling agents such as γ-mercaptopropyl trimethoxy silane. The amount of the adhesion-improving agent ranges from 0 to 5 part by mass, preferably 0.1 to 1 part by mass, relative to total 100 parts by mass of the components (A) and (B).

(J) Inorganic Filler

The inorganic filler may be added in the present composition to give a cured product the effects of diffusing a light from a LED, preventing precipitation of the fluorescent material and reducing an expansion coefficient. Any inorganic filler having the afore-mentioned effects can be used and is not limited. Examples of the inorganic filler include silica, titanium oxide, zinc aluminum oxide and a calcium carbonate. An amount of the inorganic filler ranges from 0 to 100 part by mass, preferably 0.1 to 50 part by mass, per total 100 parts by mass of the components (A) and (B).

The present composition can be prepared in a method where a composition comprising the silicone-modified epoxy compound (A), the curing agent (B) and the polyhydric alcohol (C) is stirred at a temperature of 40 to 100 degrees C, preferably 60 to 80 degrees C, for 1 to 100 hours, preferably 2 to 12 hours, more preferably 2 to 5 hours, and the product thus obtained is cooled to room temperature and, subsequently, the curing catalyst (D) and, if needed, components (E) to (J) are added thereto. The stirring may be conducted in a planetary mixer or Shinagawa mixer according to any conventional method. The viscosity of the present composition, as determined with a rotational viscometer at 23 degrees C, ranges from 10 to 1,000,000 mPa·s, preferably 100 to 1,000,000 mPa·s.

The curing of the present composition is conducted at 25 to 200 degrees C, preferably 100 to 150 degrees, for 3 minutes to 72 hours, preferably 4 to 6 hours. Curing conditions may be selected for balance of process conditions, productivity and heat resistance of a light emitting element and a housing. In a case of transfer molding or injection molding, molding may be conducted at a temperature of 150 to 180 degrees C and a pressure of 20 to 50 kgf/cm$^2$ for 1 to 5 minutes. Further, post-curing may be conducted at 150 to 200 degrees C for 1 to 4 hours.

The cured product obtained from the present composition has an alkyl chain derived from the polyhydric alcohol in a cross-linked structure, and has a low gas permeability and excellent curability in a form of a thin film together with good light transmission and crack resistance. Therefore, the present composition can be advantageously used as a protective and coating material for optical semiconductor elements such as light emitting diodes (LED), organic electroluminescent elements (organic EL), laser diodes and LED arrays.

A method for the protecting and coating an optical semiconductor element with the present cured product is not limited to any particular one. For example, an optical semiconductor element is placed in a housing having an opening, and the present composition is fed to cover the optical semiconductor element, and then the composition is cured. Alternatively, an optical semiconductor element is mounted on a matrix-type substrate, followed by a printing method, a transfer molding, injection molding or compression molding.

When an optical semiconductor element is coated and protected by a potting or injection method, the present composition is preferably liquid. When an optical semiconductor device is produced by a transfer molding, a solid and pelletized composition, a liquid composition may be thickened to solid, and pelletized to be used for molding.

EXAMPLES

The present invention will be explained below in further detail with reference to a series of examples and comparative examples, though the present invention is in no way limited by these examples. In the following description, the term "part" refers to "part by mass".

[Preparation 1]
(A) Silicone-Modified Epoxy Compound

In a 0.5 liter separable flask, placed were 157.0 grams (0.56 mol) of 1-allyl-3,5-diglycidylisocyanurate and 184.8 grams (0.25 mol) of hydrogensiloxane represented by the following formula (9)

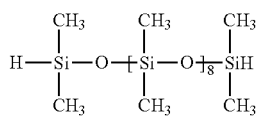

to which a 2% solution of chloroplatinic acid in octyl alcohol, containing 20 ppm of platinum metal, was added. The mixture thus obtained was subjected to a reaction at an elevated temperature from starting 80 degrees C to 100 degrees C for 6 hours. Subsequently, unreacted materials were removed by distillation under reduced pressure to obtain 318 g of silicone-modified epoxy compound I represented by the following formula (10) with a yield of 93%.

The obtained silicone-modified epoxy compound I showed the following properties:

Epoxy equivalent weight, determined by GT-100, ex Mistubishi Chemical Corporation: 330 g/mol, Refractive index at 25 degrees C, determined by RX5000, ex ATAGO: 1.456, Elemental analysis: C: 0.4088 (0.4096), Si: 0.2166 (0.2177), O: 0.2363 (0.2356), N: 0.0642 (0.0651), H: 0.0741 (0.0719), wherein the values in parentheses are the theoretical values.

[Preparation 2]
(A) Silicone-Modified Epoxy Compound II

In a 0.5 liter separable flask, placed were 56.5 grams (0.2 mol) of 1-allyl-3,5-diglycidylisocyanurate and 31.6 grams (0.096 mol) of hydrogensiloxane represented by the following formula (11)

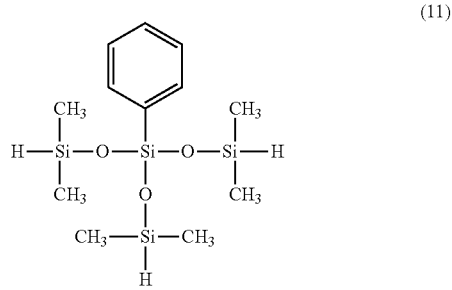

to which a 2% solution of chloroplatinic acid in octyl alcohol, containing 20 ppm of platinum metal, was added. The mixture thus obtained was subjected to a reaction at an elevated temperature from starting 80 degrees C to 100 degrees C for 6 hours. Subsequently, unreacted materials were removed by distillation under reduced pressure to obtain silicone-modified epoxy compound II represented by the following formula (12).

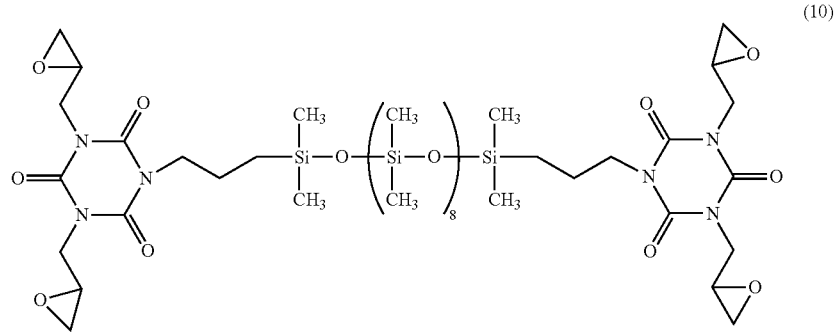

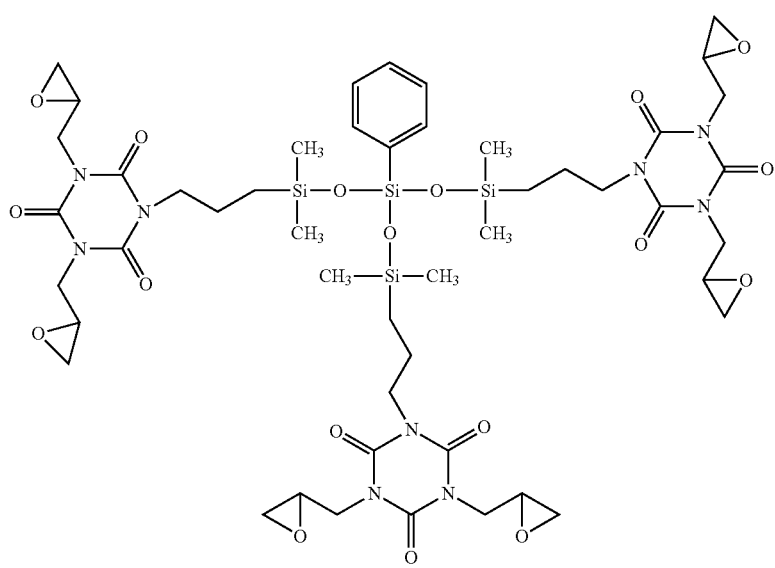

(12)

The obtained silicone-modified epoxy compound II showed the following properties:
Epoxy equivalent weight, determined by GT-100, ex Mistubishi Chemical Corporation: 196 g/mol,
Elemental analysis: C: 0.4891 (0.4909), Si: 0.0944 (0.0957), O: 0.2482 (0.2452), N: 0.1066 (0.1073), H: 0.0617 (0.0609), wherein the values in parentheses are the theoretical values.

Examples 1 to 4, and Comparative Examples 1 and 2

Each of silicone-modified epoxy compounds I and II obtained in Preparations 1 and 2 and the following components were used in the amounts shown in Table 1 below.
(B) Curing Agent:
  4-Methylhexahydrophthalic anhydride, RIKACID MH, ex New Japan Chemical Co., Ltd.
(C) Polyhydric Alcohol:
  1,3-Propanediol,
  1,4-Butanediol
(D) Curing Catalyst:
  Quaternary phosphonium salt, U-CAT5003, ex San-Apro Co., Ltd.
(F) Antioxidant:
  1. Hindered phenol antioxidant: pentaerythritol tetrakis[3-(3,5-di-tert-butyl-4-hydroxyphenyl)propionate]
  2. Phosphorus antioxidants: triphenyl phosphite
(G) Ultraviolet Absorbing Agent:
  2,2,4,4-Tetramethyl-20-(beta-myristyl-oxycarbonyl)-ethyl-7-oxa-3,20-diaza-dispiro[5.1.11.2]-heneicosanone-21
(I) Adhesion-Improving Agent:
  γ-Mercaptopropyltrimethoxysilane, KBM803, ex Shin-Etsu Chemical Co., Ltd.

The silicone-modified epoxy compound (A), the curing agent (B) and the polyhydric alcohol (C) were mixed in the amounts shown in Table 1 below. The mixture was stirred at 80 degrees C for 3 hours and cooled to room temperature, and then components (D) to (G) were added thereto in the amounts shown in Table 1 below. The composition was cured at 100 degrees C for 2 hours, and subsequently at 150 degrees C for 4 hours. A viscosity of each of the compositions and properties of each of the cured products were evaluated in the following methods. The results are as shown in Table 1.

(1) Appearance
  Appearance of the each of the cured products was observed visually to evaluate the discoloration and the transparency.
(2) Hardness
  Hardness (type D) of the each of the cured products was determined in accordance with the Japanese Industrial Standards (JIS) K6301.
(3) Viscosity
  A viscosity of the composition before cured was determined at 23 degrees C with BM-type rotational viscometer ex Toki Sangyo Co., Ltd.
(4) Glass Transition Temperature and Average Expansion Coefficient
  A test piece which had a width of 5 mm, a thickness of 4 mm and a length of 15 mm was prepared by cutting the cured product. The test piece was heated, starting from −100 degrees C to 300 degrees C at a rate of temperature increase of 5° C./minute, with thermal analyzer EXSTAR6000TMA, ex SII Nanotechnology Inc. A point of inflexion in a coefficient of expansion was taken as a glass transition temperature (Tg). Further, average expansion coefficients below Tg and above Tg were determined, respectively.
(5) Flexural Strength and Flexural Elastic Modulus
  A test piece which had a width of 5 mm, a thickness of 4 mm and a length of 100 mm was prepared by cutting the cured product. Flexural strength and a flexural elastic modulus were determined in accordance with the Japanese Industrial Standards (JIS) K6911 with Autograph measuring device AGS-50, ex Shimadzu Corporation.
(6) Light Transmission
  A cured product of a thickness of 1 mm was prepared and heated at 150 degrees C for 400 hours. The light transmittances ($T_0$) at of the sample before and after the heating for wavelengths of from 300 nm to 800 nm were determined with a spectrophotometer U-4100, ex Hitachi High-Technologies Corporation.
(7) Moisture Permeability
  Moisture permeability of each of the cured products was determined in accordance with the Japanese Industrial Standards (JIS) 20208.
(8) Thin-Film Curability
  A 0.18 mm sheet which had a width of 2 cm, a length of 5 cm and a thickness of 0.18 mm was produced from each of the compositions. The micro hardness of the surface of the sheet was determined using a Shimadzu Dynamic Ultra Micro Hardness Tester BUH-W201S, ex Shimadzu Corporation.

TABLE 1

|   | Component, part by mass | Examples | | | | Comparative Examples | |
|---|---|---|---|---|---|---|---|
|   |   | 1 | 2 | 3 | 4 | 1 | 2 |
| (A) | Silicone-modified epoxy compound I | 64.8 |  | 64.8 |  | 66.1 |  |
|  | Silicone-modified epoxy compound II |  | 51.4 |  | 51.4 |  | 53.8 |
| (B) | Curing agent | 35.2 | 48.6 | 35.2 | 48.6 | 33.9 | 46.2 |
|  | Curing agent/Epoxy group, equivalent ratio | 1.0 | 1.1 | 1.0 | 1.1 | 1.0 | 1.0 |
| (C) | 1,3-Propanediol | 2.02 | 1.99 |  |  |  |  |
|  | 1,4-Butanediol |  |  | 2.40 | 2.41 |  |  |
|  | Polyhydric alcohol/Curing agent, equivalent ratio | 0.13 | 0.09 | 0.13 | 0.09 |  |  |
| (D) | Curing catalyst | 0.32 | 0.32 | 0.32 | 0.32 | 0.32 | 0.32 |
| (F) | Antioxidant 1 | 0.1 | 0.1 | 0.1 | 0.1 | 0.1 | 0.1 |
| (F) | Antioxidant 2 | 0.05 | 0.05 | 0.05 | 0.05 | 0.05 | 0.05 |
| (G) | Ultraviolet absorbing agent | 0.1 | 0.1 | 0.1 | 0.1 | 0.1 | 0.1 |
| (I) | Adhesion-improving agent | 0.25 | 0.25 | 0.25 | 0.25 | 0.25 | 0.25 |
| Properties | Appearance | colorless and transparent | colorless and transparent | colorless and transparent | colorless and transparent | colorless and transparent | colorless and transparent |
|  | Hardness, Type D | 67 | 73 | 69 | 74 | 65 | 88 |
|  | Viscosity, Pa · s | 4.7 | 5.5 | 6.6 | 7.4 | 1.0 | 12 |
|  | Glass Transition Temperature, ° C. | 80 | 87 | 72 | 90 | 120 | 155 |
|  | Average Expansion Coefficient, below Tg | 150 | 140 | 160 | 160 | 140 | 90.1 |
|  | Average Expansion Coefficient, above Tg | 190 | 220 | 188 | 210 | 220 | 170 |
|  | Flexural Strength, MPa | 52 | 55 | 40 | 85 | 110 | 55 |
|  | Flexural Elastic Modulus, Mpa | 650 | 880 | 660 | 850 | 600 | 1300 |
|  | Light transmittance, $T_0$, % | 99 | 97 | 99 | 98 | 97 | 99 |
|  | Moisture permeability, g/m² · 24 hr | 5 | 4 | 6 | 5 | 22 | 17 |
|  | Curability, MPa | 20 | 24 | 19 | 30 | 1 | 2 |

As seen in Table 1, the cured products obtained in Comparative Examples 1 and 2, which did not have an alkyl chain derived from a polyhydric alcohol, had the poor gas permeability and curability in a form of a thin film. In contrast, the cured product from the present compositions which had excellent curability in a form of a thin film, low gas permeability, light transmission and crack resistance.

INDUSTRIAL APPLICABILITY

The present composition can provide a cured product which has low gas permeability and excellent curability in a form of a thin film, and can be advantageously used as an encapsulating material for optical semiconductor elements to give highly-reliable encapsulation.

The invention claimed is:

1. A composition comprising:
(i) a curable blend formed by mixing (A), (B), and (C) at a temperature of 40 to 100° C. for 1 to 100 hours, causing at least a portion of (C) to react with (A), (B) or both (A) and (B); and
(ii) (D) 0.1 to 3 parts by mass of a curing catalyst per total 100 parts by mass of the aforesaid components (A) and (B); wherein
(A) is a silicone-modified epoxy compound represented by the following formula (1)

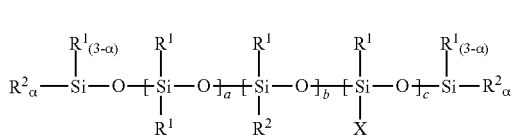

wherein $R^1$ is, independently of each other, a substituted or unsubstituted monovalent hydrocarbon group having 1 to 20 carbon atoms, $R^2$ is a group represented by the following formula (2), X is a group represented by the following formula (3), c is an integer of from 0 to 10, a and b are, independently of each other, an integer of from 0 to 100, provided that $0 \leq a+b \leq 100$, and α is, independently of each other, 0 or 1, provided that the aforesaid formula (1) has at least one $R^2$,

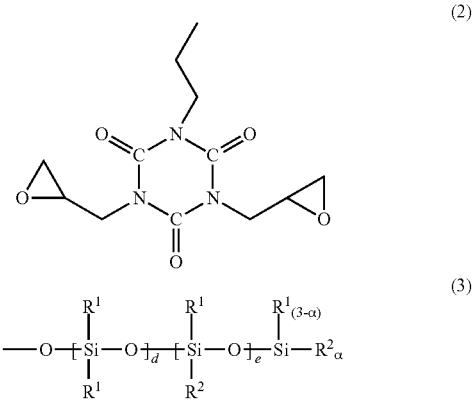

wherein d and e are, independently of each other, an integer of from 0 to 100, provided that $0 \leq d+e \leq 100$, and α is as defined above;
(B) is a curing agent provided in an amount of 0.5 to 1.5 equivalents per epoxy equivalent of the component (A); and
(C) is a polyhydric alcohol provided in an amount of 0.01 to 1.0 equivalents per equivalent of the curing agent (B).

2. The composition according to claim 1, which composition comprising further comprises the following components:
(E) 0 to 50 parts by mass of an epoxy resin other than component (A),
(F) 0 to 10 parts by mass of an antioxidant, (G) 0 to 10 parts by mass of an ultraviolet absorbing agent,
(H) 0 to 100 parts by mass of a fluorescent material,
(I) 0 to 5 parts by mass of an adhesion-improving agent, and
(J) 0 to 100 parts by mass of an inorganic filler, relative to total 100 parts by mass of the components (A) and (B), provided that a total of the amounts of the components (E) to (J) is not 0 parts by mass.

3. The composition according to claim 1 or 2, wherein the curing agent is an acid anhydride.

4. The composition according to claim 2, wherein the epoxy resin is one selected from the group consisting of hydrogenated epoxy resins, alicyclic epoxy resins and epoxy resin, having an isocyanurate ring.

5. The composition according to claim 2, wherein the antioxidant is at least one selected from the group consisting of hindered phenol antioxidants and phosphorus antioxidants.

6. The composition according to claim 2, wherein the ultraviolet absorbing agent is a hindered amine ultraviolet absorbing agent.

7. The composition according to claim 2, wherein the adhesion-improving agent is a mercapto silane coupling agent.

8. The composition according to claim 1, wherein the polyhydric alcohol is at least one selected from the group consisting of ethylene glycol, diethylene glycol, trimethylene glycol, triethylene glycol, propylene glycol, 1,2-propanediol, 1,3-propanediol, 1,4-butanediol, 1,6-hexanediol, hydroquinone and glycerin.

9. The composition according to claim 1, wherein the curing catalyst is a quaternary phosphonium salt.

10. A method for preparing the composition according to claim 1, comprising steps of:
   forming the curable blend by mixing (A), (B), and (C) at a temperature of 40 to 100° C. for 1 to 100 hours, causing at least a portion of (C) to react with (A), (B), or both (A) and (B); and
   adding (D) to the curable blend.

11. A cured product obtained by curing the composition according to claim 1.

* * * * *